US011121229B2

(12) United States Patent
Lin et al.

(10) Patent No.: US 11,121,229 B2
(45) Date of Patent: Sep. 14, 2021

(54) METHODS OF FABRICATING SEMICONDUCTOR STRUCTURES AND HIGH ELECTRON MOBILITY TRANSISTORS

(71) Applicant: Vanguard International Semiconductor Corporation, Hsinchu (TW)

(72) Inventors: Yung-Fung Lin, Taoyuan (TW); Yu-Chieh Chou, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/857,161

(22) Filed: Dec. 28, 2017

(65) Prior Publication Data

US 2019/0207012 A1 Jul. 4, 2019

(51) Int. Cl.
*H01L 29/78* (2006.01)
*H01L 29/06* (2006.01)
(Continued)

(52) U.S. Cl.
CPC .... *H01L 29/66462* (2013.01); *H01L 21/0254* (2013.01); *H01L 21/30621* (2013.01);
(Continued)

(58) Field of Classification Search
CPC ......... H01L 21/30621; H01L 21/31116; H01L 29/66462; H01L 29/2003; H01L 21/3065;
(Continued)

(56) References Cited

U.S. PATENT DOCUMENTS 5,924,000 A * 7/1999 Linliu ............... H01L 21/32137
257/E21.312
8,624,296 B1 * 1/2014 Wong ................ H01L 29/66462
257/194
(Continued)

FOREIGN PATENT DOCUMENTS

CN 102214567 A 10/2011
CN 102237361 A 11/2011
(Continued)

OTHER PUBLICATIONS

Taiwanese Office Action and Search Report for Taiwanese Application No. 106137366, dated Jul. 20, 2018.
(Continued)

*Primary Examiner* — Brian Turner
(74) *Attorney, Agent, or Firm* — Birch, Stewart, Kolasch & Birch, LLP

(57) ABSTRACT

A method of fabricating a semiconductor structure includes forming a GaN-based semiconductor layer on a substrate, forming a silicon-containing insulating layer on the GaN-based semiconductor layer, forming a recess in the silicon-containing insulating layer in a first etching step, wherein the first etching step is performed by using a fluorine-containing etchant and applying a first bias power, and enlarging the recess to extend into the GaN-based semiconductor layer in a second etching step, wherein the second etching step is performed by using the same fluorine-containing etchant as the first etching step and applying a second bias power that is greater than the first bias power. In addition, a method of fabricating a high electron mobility transistor is provided.

12 Claims, 13 Drawing Sheets

(51) Int. Cl.
  *H01L 29/66* (2006.01)
  *H01L 29/778* (2006.01)
  *H01L 29/20* (2006.01)
  *H01L 21/02* (2006.01)
  *H01L 21/311* (2006.01)
  *H01L 29/417* (2006.01)
  *H01L 21/306* (2006.01)
  *H01L 29/205* (2006.01)

(52) U.S. Cl.
  CPC .. *H01L 21/31116* (2013.01); *H01L 21/31144* (2013.01); *H01L 29/2003* (2013.01); *H01L 29/205* (2013.01); *H01L 29/4175* (2013.01); *H01L 29/7787* (2013.01); *H01L 21/0214* (2013.01); *H01L 21/0217* (2013.01); *H01L 21/02164* (2013.01)

(58) Field of Classification Search
  CPC ............. H01L 21/02241; H01L 29/205; H01L 29/7787; H01J 37/32357; H01J 37/3244; H01J 2237/334; H01J 2237/2001; H01J 2237/1825
  See application file for complete search history.

(56) References Cited

U.S. PATENT DOCUMENTS

| | | | | |
|---|---|---|---|---|
| 9,024,368 | B1* | 5/2015 | Yu | H01L 29/7848 257/288 |
| 2003/0080343 | A1* | 5/2003 | Tominaga | H01L 33/08 257/89 |
| 2006/0131271 | A1* | 6/2006 | Kiermasz | C03C 23/006 216/67 |
| 2006/0202272 | A1 | 9/2006 | Wu et al. | |
| 2008/0194075 | A1* | 8/2008 | Wu | H01L 21/76224 438/425 |
| 2008/0284022 | A1* | 11/2008 | Ehara | H01L 21/28229 257/751 |
| 2009/0057720 | A1* | 3/2009 | Kaneko | H01L 29/432 257/194 |
| 2009/0278236 | A1* | 11/2009 | Sato | H01L 21/6836 257/620 |
| 2011/0089141 | A1* | 4/2011 | Tanaka | B81C 1/00103 216/47 |
| 2011/0227132 | A1* | 9/2011 | Anda | H01L 29/4236 257/192 |
| 2011/0260216 | A1* | 10/2011 | Hebert | H01L 21/8258 257/194 |
| 2012/0021598 | A1* | 1/2012 | Kawakubo | H01L 21/30621 438/612 |
| 2012/0056191 | A1* | 3/2012 | Endo | H01L 21/30612 257/76 |
| 2012/0217602 | A1* | 8/2012 | Enomoto | H01L 27/14614 257/432 |
| 2012/0280244 | A1* | 11/2012 | Hwang | H01L 29/66462 257/76 |
| 2013/0015460 | A1* | 1/2013 | Chen | H01L 29/66462 257/76 |
| 2013/0214287 | A1* | 8/2013 | Okamoto | H01L 21/0254 257/76 |
| 2014/0302673 | A1* | 10/2014 | Kondo | H01L 21/30621 438/666 |
| 2015/0056766 | A1* | 2/2015 | Yu | H01L 29/0843 438/172 |
| 2015/0145004 | A1* | 5/2015 | Inoue | H01L 29/205 257/192 |
| 2015/0303066 | A1* | 10/2015 | Higashihara | H01L 21/30621 257/76 |
| 2016/0111329 | A1* | 4/2016 | Zhang | H01L 21/32139 257/770 |
| 2016/0133785 | A1* | 5/2016 | Kashima | H01L 33/10 257/76 |
| 2016/0358782 | A1* | 12/2016 | Yang | H01L 21/30621 |
| 2017/0141218 | A1* | 5/2017 | Iucolano | H01L 21/0254 |
| 2017/0345922 | A1* | 11/2017 | Iucolano | H01L 21/02458 |
| 2018/0337047 | A1* | 11/2018 | Fung | H01L 21/0338 |

FOREIGN PATENT DOCUMENTS

| | | |
|---|---|---|
| CN | 103227198 A | 7/2013 |
| CN | 101727024 B | 3/2014 |
| CN | 106206285 A | 12/2016 |
| CN | 106711038 A | 5/2017 |
| TW | 201320333 A1 | 5/2013 |
| TW | 201417281 A | 5/2014 |
| TW | 201440222 A | 10/2014 |

OTHER PUBLICATIONS

Chinese Office Action and Search Report for Chinese Application No. 201711090586.5 dated Jul. 1, 2021.

* cited by examiner

METHODS OF FABRICATING SEMICONDUCTOR STRUCTURES AND HIGH ELECTRON MOBILITY TRANSISTORS

BACKGROUND

Technical Field

The disclosure relates to semiconductor fabricating technologies, and more particularly, to etching processes for methods of fabricating semiconductor structures.

Description of the Related Art

Gallium nitride-based (GaN-based) semiconductor materials have many excellent characteristics, such as high thermal resistance, wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

With the developments of GaN-based semiconductor materials, these photoelectric elements which use GaN-based semiconductor materials are applied in the more critical working environments, such as those with higher frequencies or higher temperatures. Therefore, the process conditions of fabricating semiconductor elements with GaN-based semiconductor materials face various new challenges.

SUMMARY

Some embodiments of the present disclosure provide a method of fabricating a semiconductor structure. The method includes forming a GaN-based semiconductor layer on a substrate, forming a silicon-containing insulating layer on the GaN-based semiconductor layer, and forming a recess in the silicon-containing insulating layer in a first etching step, wherein the first etching step is performed by using a fluorine-containing etchant and applying a first bias power. The method further includes enlarging the recess to extend into the GaN-based semiconductor layer in a second etching step, wherein the second etching step is performed by using the same fluorine-containing etchant as the first etching step and applying a second bias power that is greater than the first bias power.

Some embodiments of the present disclosure provide a method of fabricating a high electron mobility transistor (HEMT). The method includes forming a GaN semiconductor layer over a substrate, forming a AlGaN semiconductor layer on the GaN semiconductor layer, forming a silicon-containing insulating layer on the AlGaN semiconductor layer, and forming a first recess and a second recess in the silicon-containing insulating layer in a first etching step, wherein the first etching step is performed by using a fluorine-containing etchant and applying a first bias power. The method further includes enlarging the first recess and the second recess to extend into the AlGaN semiconductor layer in a second etching step, wherein the second etching step is performed by using the same fluorine-containing etchant as the first etching step and applying a second bias power that is greater than the first bias power. The method also includes forming a source contact and a drain contact in the first recess and the second recess respectively, and forming a gate contact between the source contact and the second contact.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn in scale, wherein.

DETAILED DESCRIPTION

Figure 1A:
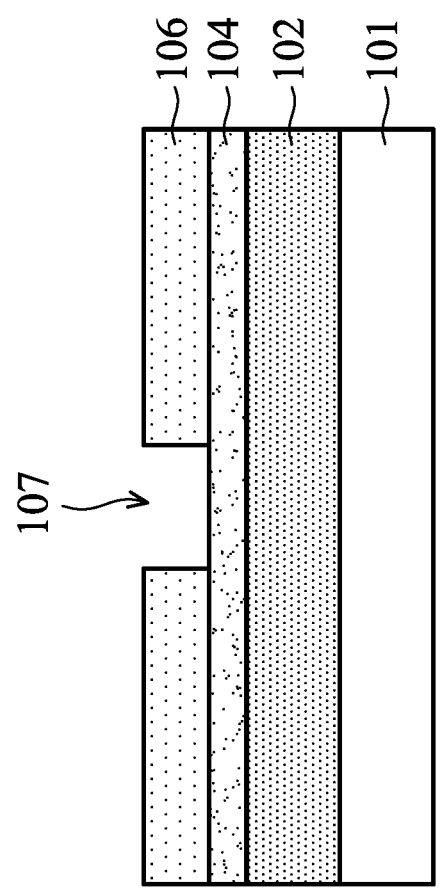
FIGS. 1A-1E illustrate cross-sectional views of intermediate stages of a method of fabricating a semiconductor structure in accordance with some embodiments of the present disclosure.

The following description provides various embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
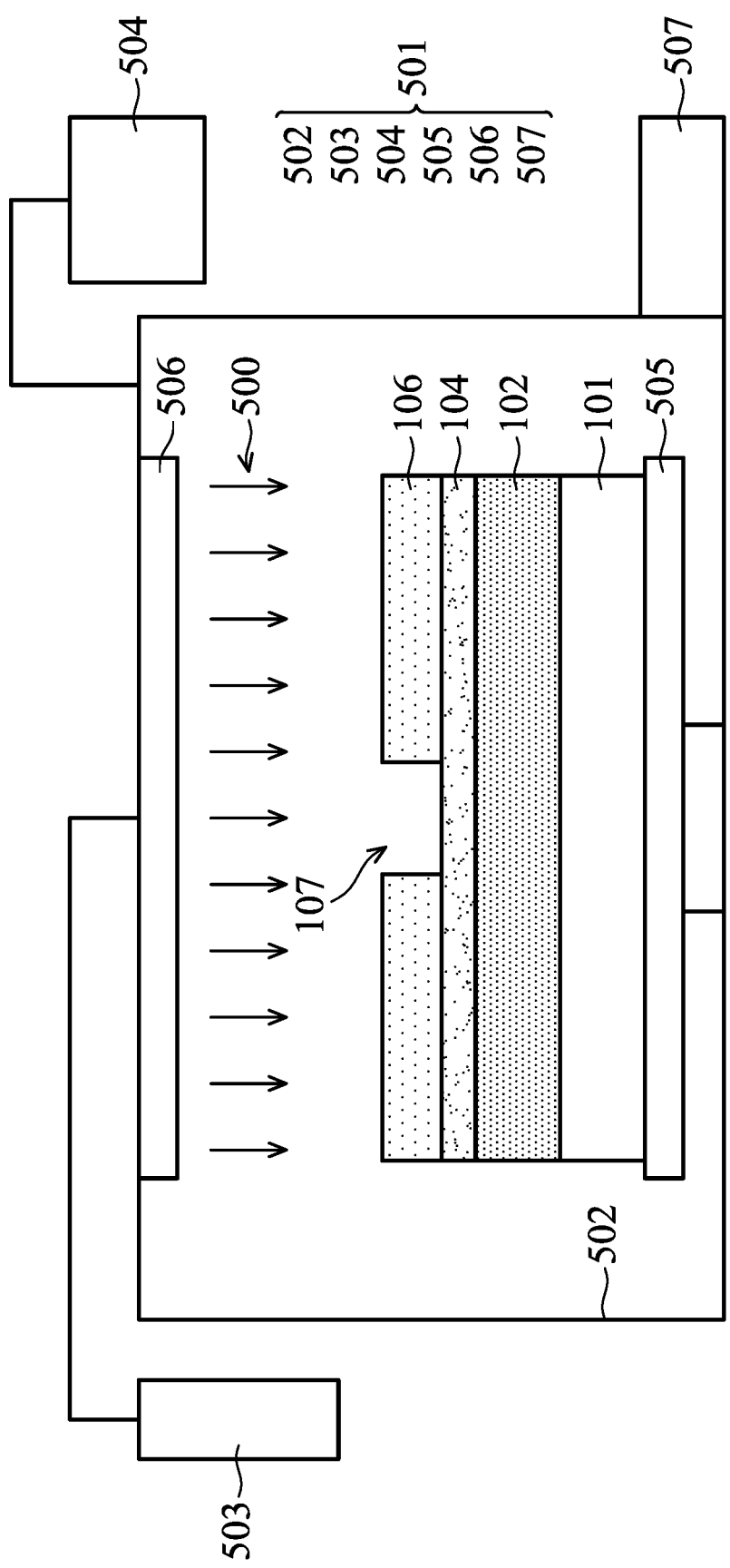
Figure 1C:
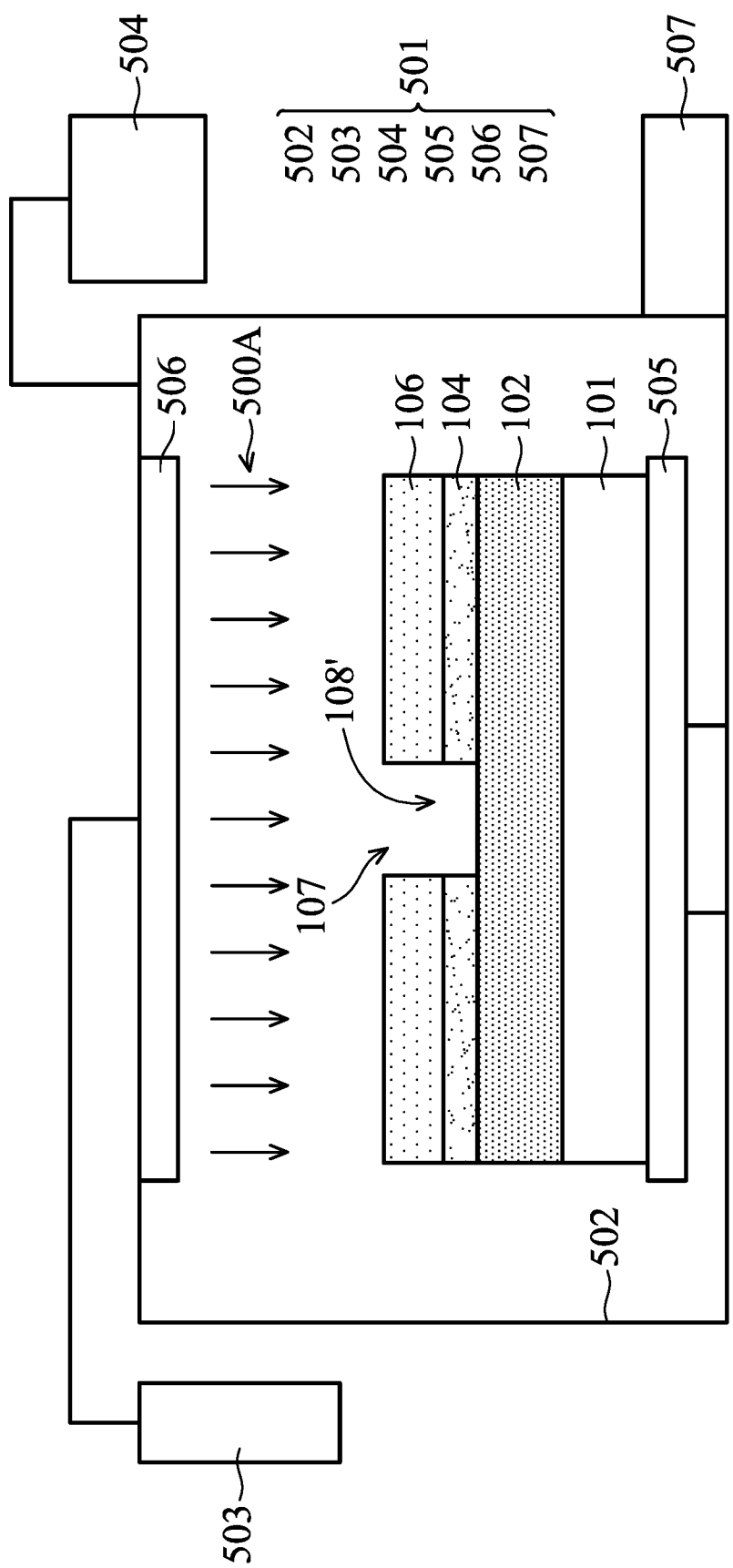
Figure 1D:
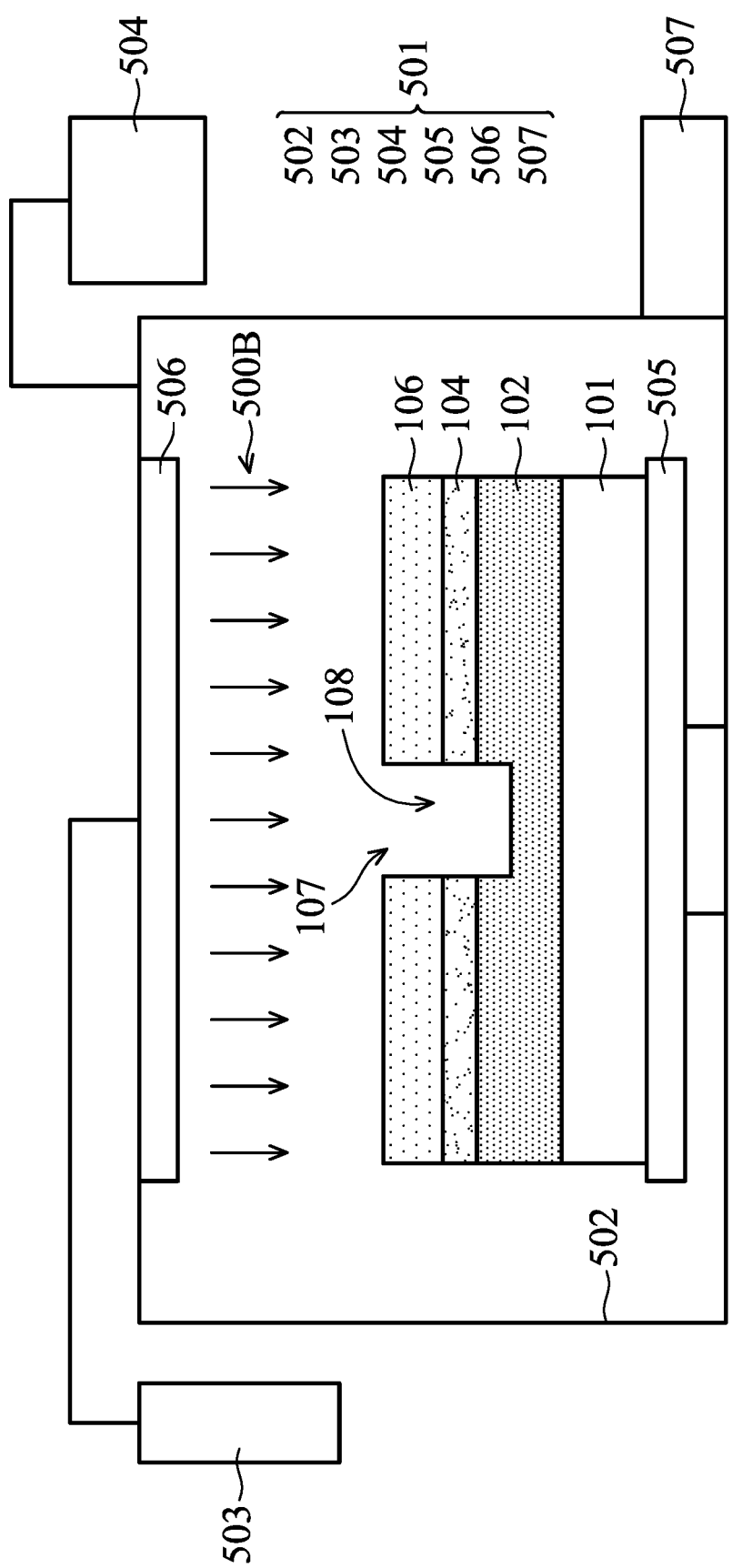
Figure 1E:
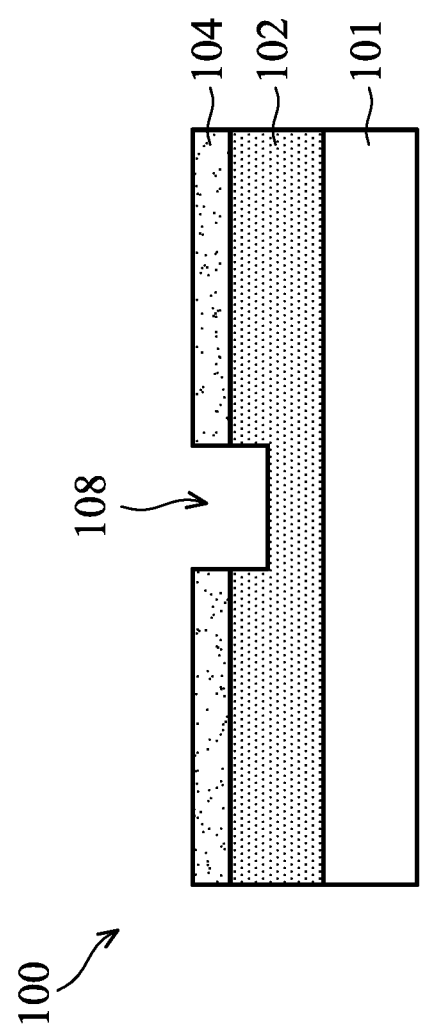
Figure 2:
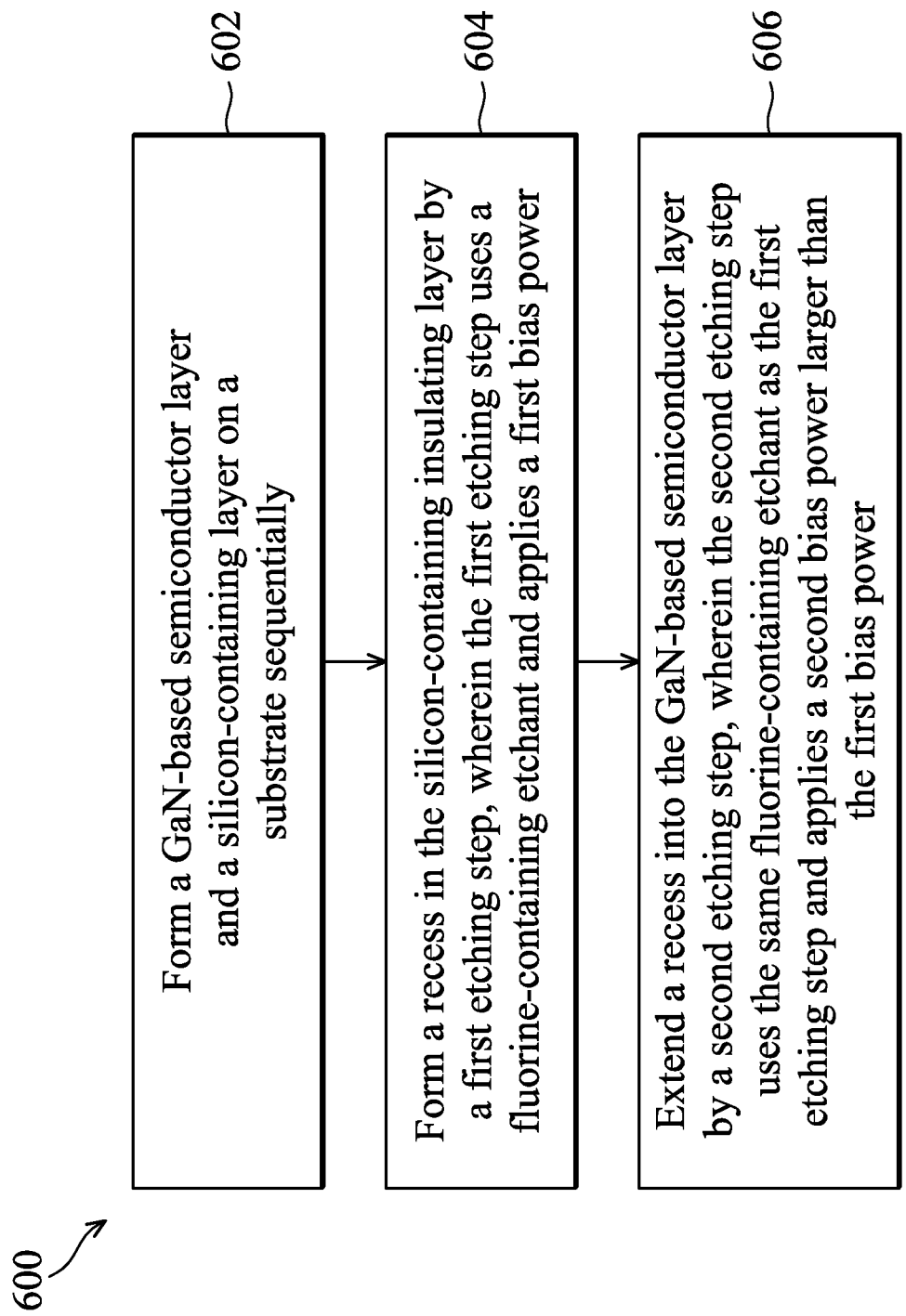
FIG. 2 illustrates a flowchart of a method of fabricating a semiconductor structure in accordance with some embodiments of the present disclosure.

FIGS. 1A-1E illustrate cross-sectional views of intermediate stages of a method of fabricating a semiconductor structure 100 shown in FIG. 1E in accordance with some embodiments of the present disclosure. The various steps of FIGS. 1A-1E are schematically reflected in the various steps of the flowchart of a method 600 shown in FIG. 2 for fabricating the semiconductor structure 100. Referring to FIG. 1A, a substrate 101 is provided, and a GaN-based semiconductor layer 102 is formed on the substrate 101. Then, a silicon-containing insulating layer 104 is formed on the GaN-based semiconductor layer 102, and a patterned mask layer 106 is formed on the silicon-containing insulating layer 104. The patterned mask layer 106 has an opening 107, and the opening 107 exposes a portion of the upper surface of the silicon-containing insulating layer 104. The respective step is illustrated in step 602 of the method 600 shown in FIG. 2.

In some embodiments of the present disclosure, the substrate 101 may be a doped (such as doped with a p-type or an n-type dopant) or an undoped semiconductor substrate, such as a silicon substrate, a silicon germanium substrate, a gallium arsenide substrate or the like. In some embodiments, the substrate 101 may be a semiconductor-on-insulator substrate, such as a silicon-on-insulator (SOI) substrate. In some embodiments, the substrate 101 may be a silicon carbide (SiC) substrate or a sapphire substrate. The selection of the substrate 101 may depend on the type of the semiconductor device to which the semiconductor substrate 100 is applied subsequently.

In some embodiments of the present disclosure, the material of the GaN-based semiconductor layer 102 may be GaN, $Al_xGa_{1-x}N$ (wherein 0<x<1), $In_xGa_{1-x}N$ (wherein 0<x<1), $In_xAl_yGa_{1-x-y}N$ (wherein 0<x+y<1), a combination thereof, a multilayered structure thereof, or the like. The GaN-based semiconductor layer 102 may be formed using an epitaxial growth process, such as metal organic chemical vapor deposition (MOCVD), hydride vapor phase epitaxy (HVPE), molecular beam epitaxy (MBE), a combination thereof, or the like. In some embodiments, the GaN-based semiconductor layer 102 may have a dopant, such as an n-type or a p-type dopant. The GaN-based semiconductor layer 102 with the dopant may be formed by in-situ doping during the epitaxial growth process.

In some embodiments of the present disclosure, the material of the silicon-containing insulating layer 104 may be silicon oxide, silicon nitride, silicon oxynitride, a combination of thereof, or the like. The silicon-containing insulating layer 104 may be formed by thermal oxidation, chemical vapor deposition (CVD), plasma enhanced CVD (PECVD), atomic layer deposition (ALD) or the like.

In some embodiments of the present disclosure, the mask layer 106 may be a photoresist layer, a hard mask layer (such as a nitride layer) or a combination thereof. In some embodiments, a bottom anti-reflective coating (BARC) layer (not shown) may be formed on the silicon-containing insulating layer 104 following by forming a material layer of the mask layer 106 on the BARC layer. Once the material layer of the mask layer 106 is formed, an opening 107 is formed in the material layer of the mask layer 106 by using photolithography technique, and the opening 107 exposes a portion of the upper surface of the silicon-containing insulating layer 104.

Referring to FIG. 1B, the substrate 101 with the GaN-based semiconductor layer 102, the silicon-containing insulating layer 104 and the mask layer 106 formed thereon, is placed into an etching equipment 501, and then an etching process 500 is performed. In some embodiments of the present disclosure, the silicon-containing insulating layer 104 and the underlying GaN-based semiconductor layer 102 are etched through the opening 107 of the mask layer 106 to form a recess 108 (shown in FIG. 1D) in the silicon-containing insulating layer 104 and the GaN-based semiconductor layer 102. In some embodiments, the etching process 500 may be a dry etching process, such as reactive ion etching (RIE), electron cyclotron resonance (ECR) etching, inductively-coupled plasma (ICP) etching or the like.

In some embodiments, as shown in FIG. 1B, the etching equipment 501 includes an etching chamber 502, a gas supply system 503, a bias power generator 504, a wafer platform 505, a shower head 506 and an etching endpoint detector 507.

The gas supply system 501 of the etching equipment 501 may provide an etchant which is used in the etching process 500, and the etchant is evenly dispersed into the etching chamber 502 through the shower head 506.

The bias power generator 504 of the etching equipment 501 may apply a bias power to the etching chamber 501 to generate a bias electric field between the upper electrode (not shown, generally disposed at the top of the etching chamber 502) and lower electrode (not shown, generally disposed inside of the wafer platform 505) of the etching equipment 501. The etchant is accelerated by the bias electric field in the etching chamber 502, and in the direction toward the wafer platform 505 to anisotropically etch the silicon-containing insulating layer 104 and the underlying GaN-based semiconductor layer 102.

The etching endpoint detector 507 of the etching equipment 501 may real-time monitor etching signals of the desired material layer to be removed in an etching process. When the etching endpoint detector 507 detects the etching endpoint of the desired material layer to be removed, the other underlying material layer begins to be exposed from the desired material layer to be removed. The period of the etching process which is from the initiation of the etching process to the etching endpoint detected by the etching endpoint detector 507 is referred to as the main-etching. In general, in order to completely remove the overlying material layer, an over-etching may be continually performed for a period after the main etching of the etching process. For example, the over-etching may be performed for a duration about 5% to 30% of that of the main etching.

Referring to FIG. 1C, after the substrate 101 with the GaN-based semiconductor layer 102, the silicon-containing insulating layer 104 and the mask layer 106 formed thereon, is placed on the wafer platform 505 of the etching equipment 501, a first etching step 500A of the etching process 500 is performed. The respective step is illustrated in step 604 of the method 600 shown in FIG. 2. In some embodiments of the present disclosure, a recess 108' is formed in the silicon-containing insulating layer 104 by the first etching step 500A. The first etching step 500A may be performed by using a fluorine-containing etchant, such as $CF_4$, $CHF_3$, $CH_2F_2$, $CH_3F$ or a combination thereof, and may be performed by applying a first bias power in a range of about 100 W to about 500 W to the etching chamber 502. It should be noted that, when the first bias power is set lower than 100 W, the fluorine-containing etchant is incapable of etching the silicon-containing insulating layer 104. When the first bias power is set greater 500 W, the etching rate of the silicon-containing insulating layer 104 by the fluorine-containing etchant is too high which results in poor etching uniformity of the silicon-containing insulating layer 104 by the first step 500A of the etching process 500. This is disadvantageous for a following second etching step 500B performed on the GaN-based semiconductor layer 102.

Referring to FIG. 1D, after the first etching step 500A of the etching process 500, the second etching step 500B of the etching process 500 is performed. The respective step is illustrated in step 606 of the method 600 shown in FIG. 2.

In some embodiments of the present disclosure, the first etching step 500A and the second etching step 500B are performed in-situ in the same etching chamber 502. In other words, after the first etching step 500A is complete, the substrate 101 is not moved out of the etching chamber 502 and the second etching step 500B is continuously performed in the etching chamber 502 without interruption. In some embodiments, the recess 108' as shown in FIG. 1C is enlarged to extend into the GaN-based semiconductor layer 102 by the second etching step 500B to form a recess 108 as shown in FIG. 1D. The second etching step 500B is performed by using the same fluorine-containing etchant as that used in the first etching step 500A and is performed by applying a second bias power that is greater than the first bias power to the etching chamber 502.

Figure 3:
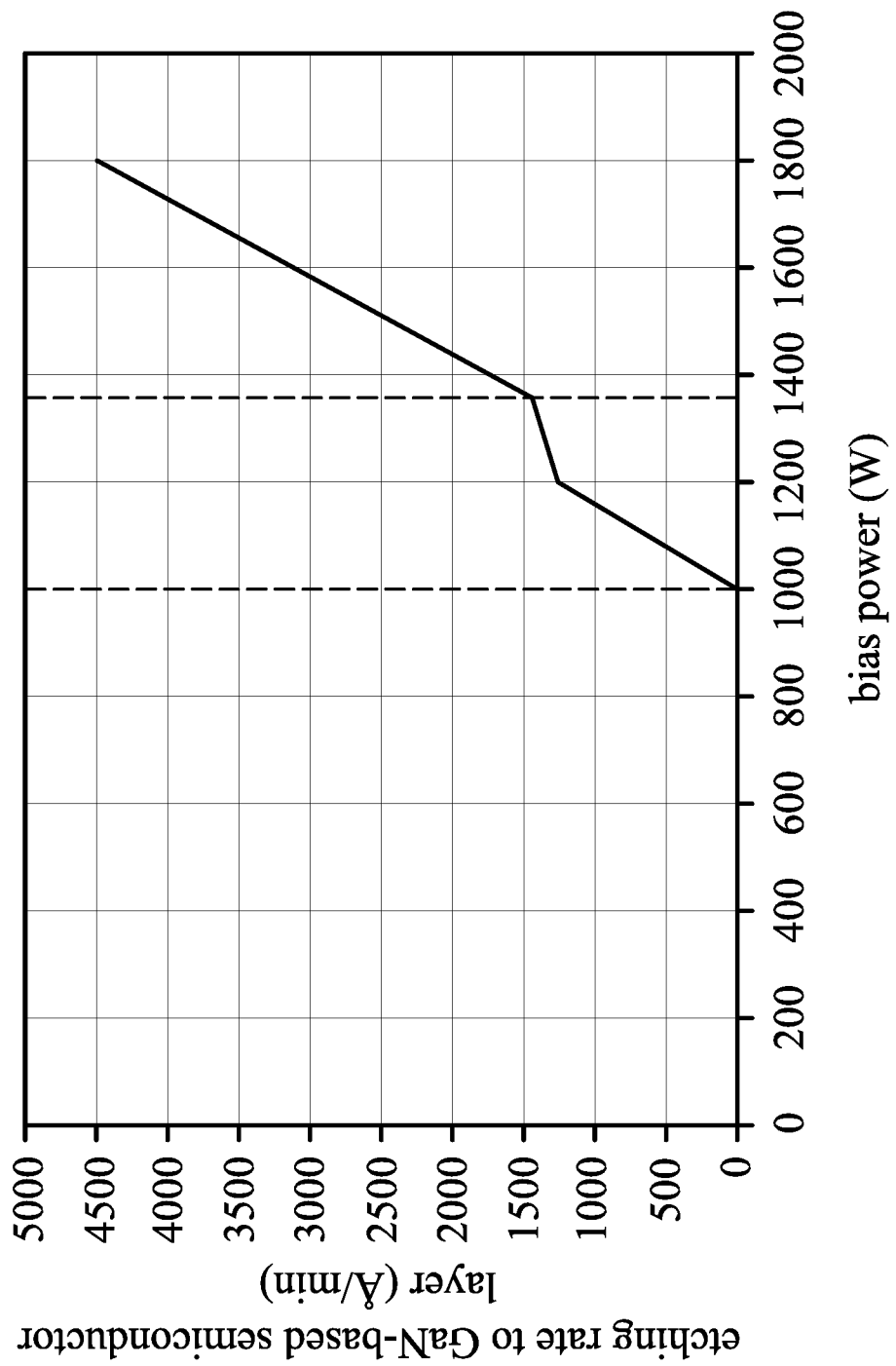
FIG. 3 shows a graph of an etching rate of a GaN-based semiconductor layer etched by a fluorine-containing etchant and an applied bias power in accordance with some embodiments of the present disclosure.

Referring to FIG. 3, it shows a graph of an etching rate of the GaN-based semiconductor layer 102 by the fluorine-containing etchant and the applied bias power in accordance with some embodiments of the present disclosure. As shown in FIG. 3, when the second bias power is set between 0 W and 1000 W, the etching rate of the GaN-based semiconductor layer 102 by the fluorine-containing etchant is almost zero. When the second bias power is set between 1000 W and 1350 W, the etching rate of the GaN-based semiconductor layer 102 by the fluorine-containing etchant gradually increases as increasing the second bias power. When the second bias power is set greater than 1350 W, the etching rate of the GaN-based semiconductor layer 102 by the fluorine-containing etchant is too high which results in poor etching uniformity of the GaN-based semiconductor layer 102 by the second etching step 500B of the etching process 500. Moreover, the lattice structure of the surface of the GaN-based semiconductor layer 102 exposed from the recess 108 may be destroyed by the fluorine-containing etchant. Therefore, in some embodiments of the present disclosure, the second bias power of the second etching step 500B may be in a range of about 1000 W to about 1350 W.

In accordance with some embodiments of the present disclosure, in the first etching step 500A, an etching selectivity of the silicon-containing insulating layer 102 to the GaN-based semiconductor layer 104 is greater than 10 and lower than 1000. Therefore, in some embodiments, the first etching step 500A may include an over-etching performed on the silicon-containing insulating layer 104. In these embodiments, the silicon-containing insulating layer 104 may be removed completely in the first etching step 500A approximately without etching the underlying GaN-based semiconductor layer 102.

In some embodiments of the present disclosure, the first etching step 500A does not perform an over-etching on the silicon-containing insulating layer 104. Since the range of the second bias power of the second etching step 500B is larger than that of the first bias power of the first etching step 500A. Therefore, in this embodiment, the remaining portion of the silicon-containing insulating layer 104 that is not removed by the main etching of the first etching step 500A may be removed by the second etching step 500B. In this embodiment, since the first etching step 500A may be performed without an over-etching, the process time of the etching process 500 can be shortened, which enhances the production efficiency of the semiconductor structure 100.

In addition, in some embodiments, the second etching step 500B may be continuously performed without interruption after the first etching step 500A is complete. In another embodiment, a ramping step may additionally be performed between the first etching step 500A and the second etching step 500B in the etching process 500, for example, setting the bias power at a value between the first bias power and the second bias power.

Referring to FIG. 1E, after the second etching step 500B of the etching process 500, an ashing process may be performed to remove the mask layer 106 on the silicon-containing insulating layer 104 to form the semiconductor structure 100. In the embodiments of the present disclosure, the semiconductor structure 100 includes the substrate 101, the GaN-based semiconductor layer 102 on the substrate 101, the silicon-containing insulating layer 104 on the GaN-based semiconductor layer 102, and the recess 108 in the silicon-containing insulating layer 104 and the GaN-based semiconductor layer 102. It should be noted that, the embodiments of the present disclosure are implemented by sequentially etching the silicon-containing insulating layer 104 and the GaN-based semiconductor layer 102 with the first etching step 500A and the second etching step 500B of the etching process 500 to form recess 108, wherein the first etching step 500A and the second etching step 500B are performed by using the same etchant and applying different bias powers in the same etching chamber 502.

In the known etching methods, the etching process for a GaN-based semiconductor layer uses a chlorine-containing etchant, such as $Cl_2$, and the etching process for a silicon-containing insulating layer uses a fluorine-containing etchant, such as $CF_4$. Therefore, in the known etching methods, it requires two etching equipment to performed etching a silicon-containing insulating layer and etching a GaN-based semiconductor layer are respectively.

In accordance with embodiments of the present disclosure, the second etching step 500B of the etching process 500 are performed by using the same fluorine-containing etchant as the first etching step 500A and applying the second bias power greater than the first bias power to etch the GaN-based semiconductor layer 102, so that etching the silicon-containing insulating layer 104 and etching the GaN-based semiconductor layer 102 can be sequentially performed in the same etching chamber 502. Therefore, in accordance with the method of the embodiments of the present disclosure for forming the semiconductor structure by in-situ etching the silicon-containing insulating layer and the GaN-based semiconductor layer, the production efficiency of semiconductor devices containing the semiconductor structure can be enhanced.

In addition, the embodiments of the present disclosure can also avoid the problem caused by an undesirable native oxide formed on the surface of the GaN-based semiconductor layer 102 during the period between the two etching processes. Therefore, the semiconductor structure formed by the etching process of in-situ etching the silicon-containing insulating layer and the GaN-based semiconductor layer according to the embodiments of the present disclosure can enhance the reliability of the semiconductor device containing this semiconductor structure.

The embodiment shown in FIGS. 1A-1E is merely an example, and the embodiments of the present disclosure are not to be limited. In addition to the above-mentioned embodiment shown in FIGS. 1A-1E, the embodiments of the present disclosure may be applied to other semiconductor structures.

Figure 4A:
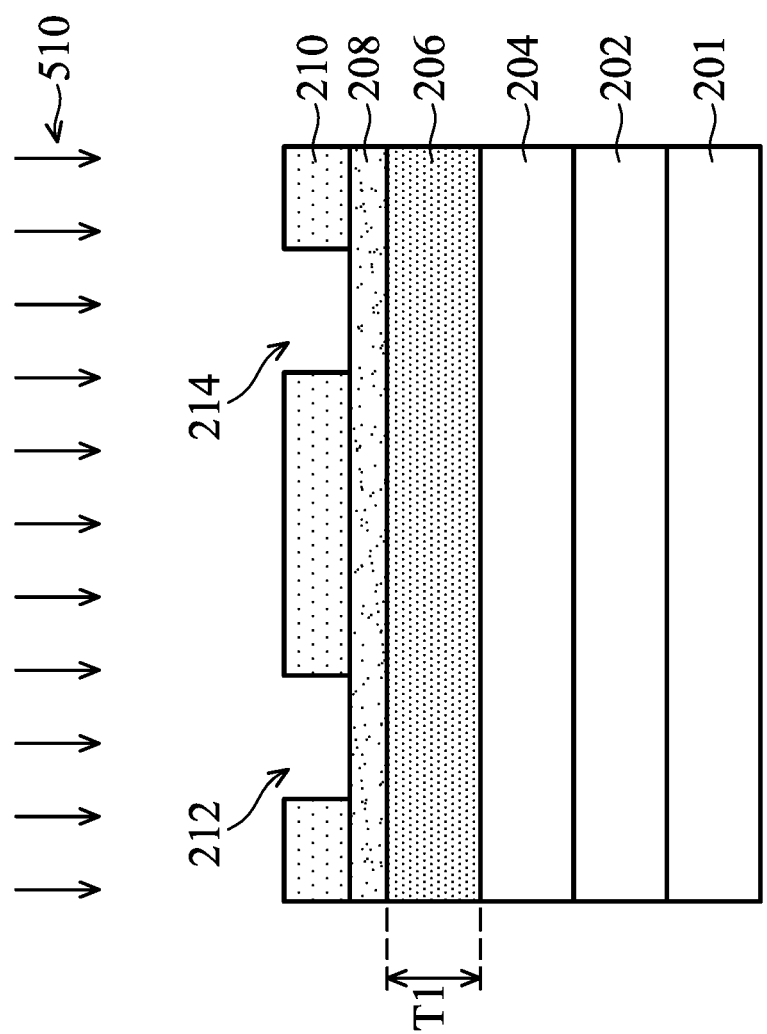
FIGS. 4A-4E illustrate cross-sectional views of intermediate stages of a method of fabricating a high electron mobility transistor (HEMT) in accordance with some other embodiments of the present disclosure.
Figure 4B:
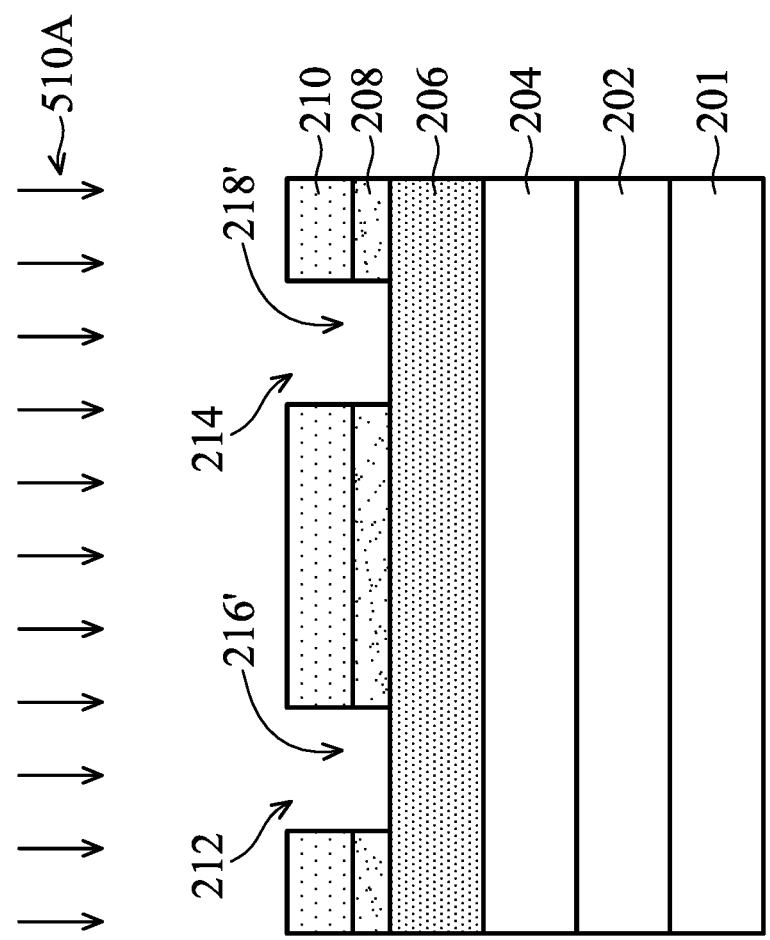
Figure 4C:
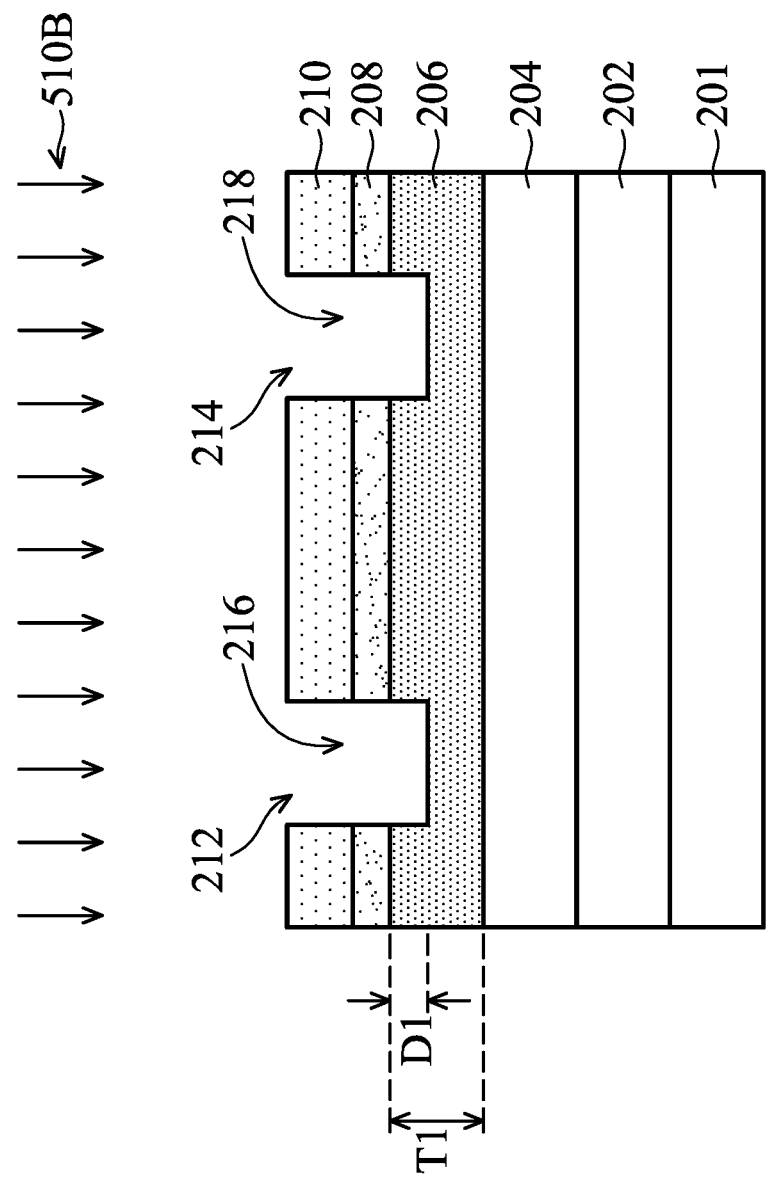
Figure 4D:
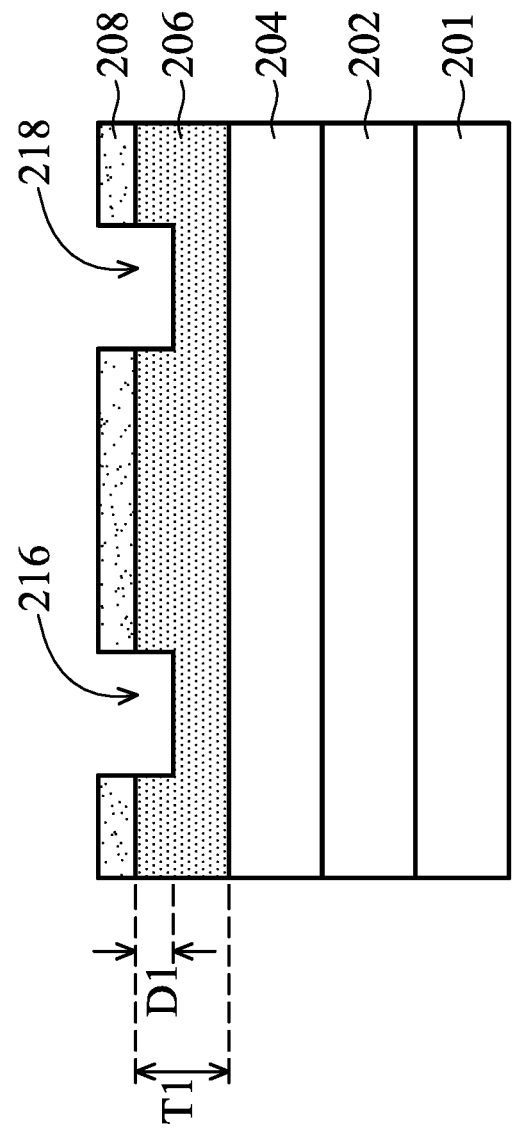
Figure 4E:
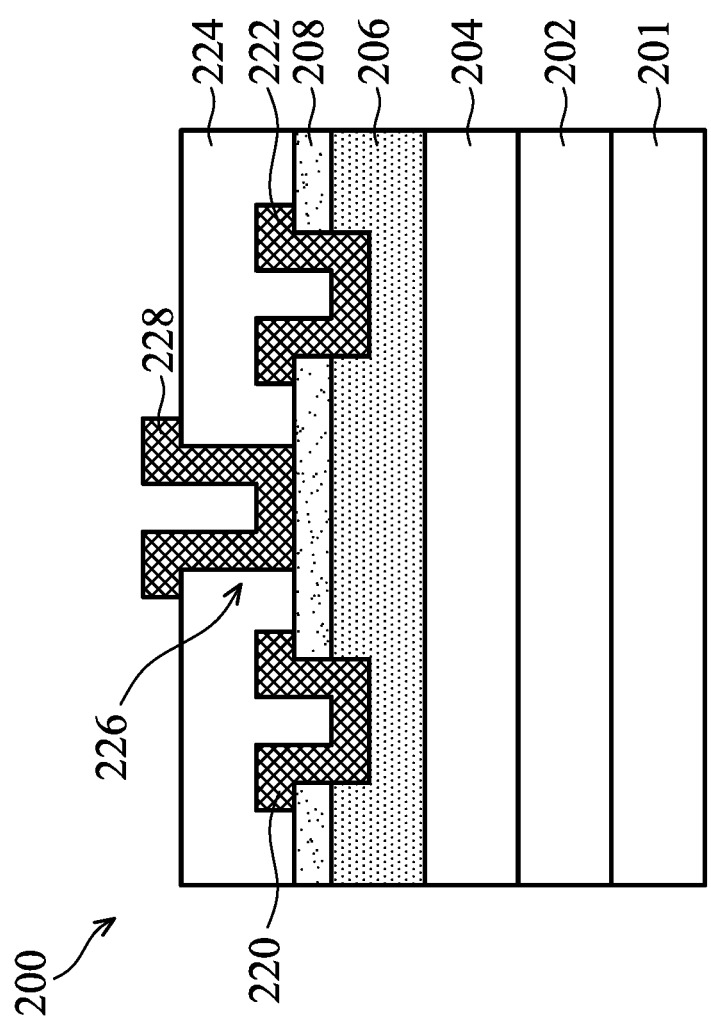

FIGS. 4A-4E illustrates cross-sectional views of intermediate stages of a method of fabricating a high electron mobility transistor (HEMT) 200 as shown in FIG. 4E in accordance with some embodiments of the present disclosure. With respect to FIG. 4A, a substrate 201 is provided.

The substrate 201 may be similar to the substrate 101 of the aforementioned FIGS. 1A-1E.

Next, a buffer layer 202 is formed on the substrate 201. The buffer layer 202 may be helpful to mitigate a stain of a GaN semiconductor layer 204 which is subsequently formed above the buffer layer 202, and to prevent defects formed in the overlying GaN semiconductor layer 204. The stain is caused by a mismatch between the GaN semiconductor layer 204 and the substrate 201. In some embodiments of the present disclosure, the material of the buffer layer 202 may be AlN, GaN, $Al_xGa_{1-x}N$ (wherein 0<x<1), a combination thereof, or the like. The buffer layer 202 may be formed by an epitaxial growth process, such as MOCVD, HVPE, MBE, a combination thereof, or the like. Although in the embodiment shown in FIG. 4A the buffer layer 202 is a single layer, the buffer layer 202 may also be a multilayered structure.

Next, the GaN semiconductor layer 204 is formed on the buffer layer 202, and an AlGaN semiconductor layer 206, for example $Al_xGa_{1-x}N$ (wherein 0<x<1) is formed on the GaN semiconductor layer 204. There is a heterogeneous interface between the GaN semiconductor layer 204 and AlGaN semiconductor layer 206 so that two-dimensional electron gas (2 DEG, not shown) is formed at the heterogeneous interface. Therefore, the HEMT 200 as shown in FIG. 4E may utilize 2 DEG as conductive carriers. In some embodiments of the present disclosure, the GaN semiconductor layer 204 and the AlGaN semiconductor layer 206 may be formed by epitaxial growth processes, such as MOCVD, HVPE, MBE, or a combination thereof. In some embodiments, the GaN semiconductor layer 204 and the AlGaN semiconductor layer 206 may have dopants, such as n-type or p-type dopants.

Next, a silicon-containing insulating layer 208 is formed on the AlGaN semiconductor layer 206. In some embodiments of the present disclosure, the silicon-containing insulating layer 208 may be a high-quality film formed by using ALD, thermal oxidation or similar deposition processes. The material of the silicon-containing insulating layer 208 may be silicon oxide, silicon nitride, silicon oxynitride, a combination thereof, or the like. The formation of the high-quality film of the silicon-containing insulating layer 208 on the AlGaN semiconductor layer 206 can prevent leak currents of a source contact 220, a drain contact 222 and a gate contact 228 (shown in FIG. 4E) that are subsequently formed.

Still referring to FIG. 4A, a material layer of a mask layer 210 is formed on the silicon-containing insulating layer 208. A first opening 212 and a second opening 214 are then formed in the material layer of the mask layer 210 by photolithographic technology. The first opening 212 and the second opening 214 expose a portion of the upper surface of the silicon-containing insulating layer 208.

Next, the substrate 201 with the buffer layer 202, the GaN semiconductor layer 204, the AlGaN semiconductor layer 206, the silicon-containing insulating layer 208 and mask layer 210 formed thereon, is placed into the etching equipment 501 as shown in FIG. 1B, and an etching process 510 is performed. Referring to FIGS. 4B and 4C, in some embodiments of the present disclosure, the etching process 510 includes a first etching step 510A and a second etching step 510B. The first etching step 510A and the second etching step 510B of the etching process 510 may be respectively similar to the first etching step 500A and the second etching step 500B of the etching process 500 as shown in FIGS. 1C and 1D.

In the embodiments of the present disclosure, the silicon-containing insulating layer 208 and the AlGaN semiconductor layer 206 are etched through the first opening 212 and the second opening 214 of the mask layer 210 to form a first recess 216 and a second recess 218 as shown in FIG. 4C.

In detail, as shown in FIG. 4B, a first recess 216' and a second recess 218' are formed in the silicon-containing insulating layer 208 by the first etching step 510A of the etching process 510. The first etching step 510A of the etching process 510 may use the same etchant and the same range of bias power as those used in the first etching step 500A of the etching process 500 of the aforementioned FIG. 1C. Next, as shown in FIG. 4C, the first recess 216' and the second recess 218' are enlarged to extend into the AlGaN semiconductor layer 206 by the second etching step 510B of the etching process 510 to form the first recess 216 and the second recess 218. The second etching step 510B of the etching process 510 may use the same etchant and the same range of bias power as those of the second etching step 500B of the etching process 500 of the aforementioned FIG. 1D.

In some embodiments, as shown in FIG. 4C, the first recess 216 and the second recess 218 extend into the AlGaN semiconductor layer 206 by a distance D1. The distance D1 may be between about 5% and about 100% of the thickness T1 of the AlGaN semiconductor layer 206. The distance D1 may depend on carrier concentration and the carrier mobility of 2 DEG used in the HEMT 200.

Referring to FIG. 4D, after the etching process 510, an ashing process may be performed to remove the mask layer 210 on the silicon-containing insulating layer 208.

Referring to FIG. 4E, a source contact 220 and a drain contact 222 are then formed in the first recess 216 and the second recess 218 respectively. The source contact 220 and the drain contact 222 are located on and electrically contact the AlGaN semiconductor layer 206. In some embodiments, the first recess 216 and the second recess 218 may be incompletely filled with the source drain contact 220 and the drain contact 222. The source contact 220 and the drain contact 222 are formed along the sidewalls and the bottom surfaces of the first recess 216 and the second recess 218, and extend onto a portion of the surface of the silicon-containing insulating layer 208. In some embodiments, the materials of the source contact 220 and the drain contact 222 may be conductive materials, such as Au, Ni, Pt, Pd, Ir, Ti, Cr, W, Al, Cu, TaN, TiN, $WSi_2$, a combination thereof, or the like. The source contact 220 and the drain contact 222 may be formed by ALD, CVD, PVD, sputtering, or the like. In some embodiments, the source contact 220 and the drain contact 222 may be formed together in the same deposition process.

Next, a passivation layer 224 is formed on the source contact 220 and the drain contact 222. The passivation layer 224 covers the source contact 220 and the drain contact 222. In some embodiments of the present disclosure, the material of the passivation layer 224 may be silicon oxide, silicon nitride, silicon oxynitride, a combination of thereof, or the like. In some embodiments, the passivation layer 224 may be formed by CVD, PECVD, ALD or the like.

Still referring to FIG. 4E, a third recess 226 is formed in the passivation layer 224 by photolithography technology and an etching process. The third recess 226 is located between the source contact 220 and the drain contact 222. Next, a gate contact 228 is formed in the third recess 226 to form a HEMT 200. In some embodiments, the gate contact 228 is located on the silicon-containing insulating layer 208 and between the source contact 220 and the drain contact 222. In some embodiments, the third recess 226 may be incompletely filled with the gate contact 228. The gate contact 228 is formed along the sidewalls and the bottom surface of the third recess 226 and extended onto a portion of the surface of the passivation layer 224. In some embodiments, the material of the gate contact 228 may be a conductive material, such as Au, Ni, Pt, Pd, Ir, Ti, Cr, W, Al, Cu, TaN, TiN, WSi$_2$, or a combination thereof. The gate contact 228 may be formed by ALD, CVD, PVD, sputtering or the like. The source contact 220 and the drain contact 222 may be in electrical contact with external circuitry by a metal layer (not shown) that passes through the passivation layer 224.

Figure 5:
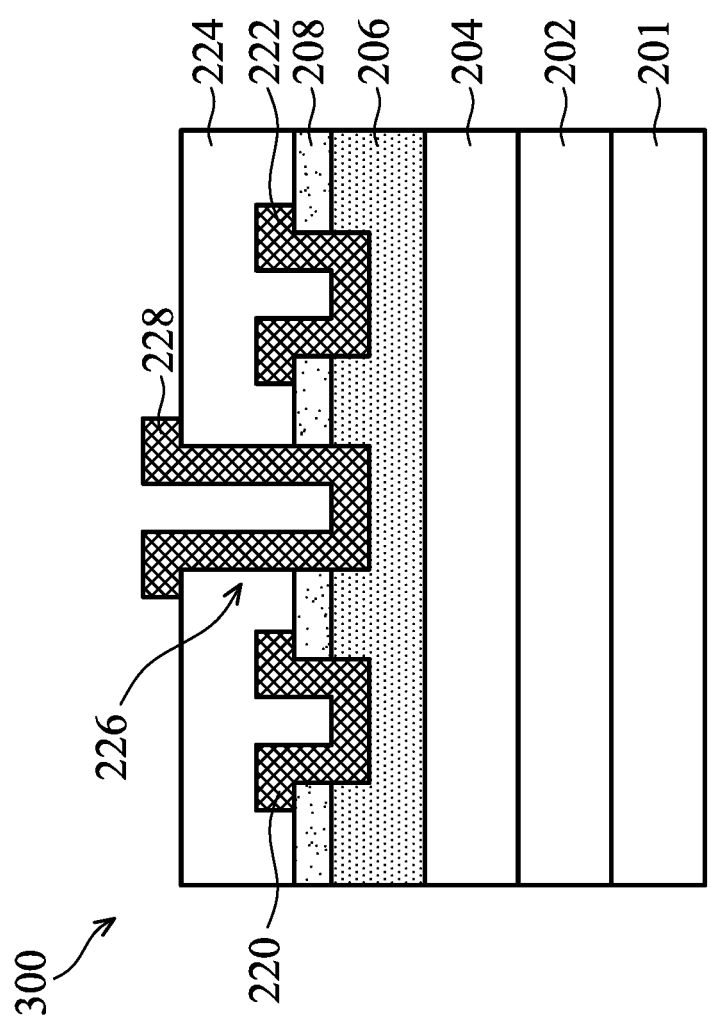
FIG. 5 is a cross-sectional view of a high electron mobility transistor (HEMT) in accordance with another embodiment of the present disclosure.

Referring to FIG. 5, the difference between the embodiments shown in FIGS. 5 and 4E is that the third recess 226 in an HEMT 300 as shown in FIG. 5 is extended into the silicon-containing insulating layer 208 and the AlGaN semiconductor layer 206. In the embodiments as shown in FIG. 5, the passivation layer 224 is a silicon-containing insulating material. The passivation layer 224 and the silicon-containing insulating layer 208 may be etched by an etching step similar to the first etching step 500A of the etching process 500 as shown in FIG. 1C. Next, the AlGaN semiconductor layer 206 may be etched by another etching step similar to the second etching step 500B of the etching process 500 as shown in FIG. 1D to form the third recess 226. In this embodiment, the gate contact 228 is formed in the third recess 226, and the bottom surface of the gate contact 228 is in direct contact with the AlGaN semiconductor layer 206 to form the HEMT 300.

In addition, in another embodiment, the method of fabricating the HEMT 300 further includes forming a gate structure (not shown) in the third recess 226 and embedded in the AlGaN semiconductor layer 206 prior to forming the gate contact 228. Thereafter, the gate contact 228 is formed in the remaining portion of the third recess 226, and the gate contact 228 is disposed on the gate structure. In some embodiments, the gate structure may be a doped GaN semiconductor layer, such as n-type GaN semiconductor layer or p-type GaN semiconductor layer. The gate structure may be formed by an epitaxial growth process, such as MOCVD, HVPE, MBE, or a combination thereof.

In summary, the embodiments of present disclosure include forming a recess in the silicon-containing insulating layer by the first etching step of the etching process, and extending the recess into the GaN-based semiconductor layer by the second etching step of the etching process, wherein the second etching step are performed by using the same fluorine-containing etchant as the first etching step and applying the second bias power greater than the first bias power of the first etching step. As a result, etching the silicon-containing insulating layer and etching the GaN-based semiconductor layer can be sequentially performed in the same etching chamber. Therefore, in accordance with the embodiments of the present disclosure to form the semiconductor structures by in-situ etching the silicon-containing insulating layer and the GaN-based semiconductor layer, the production efficiency of semiconductor devices containing the semiconductor structures can be enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a high electron mobility transistor (HEMT), comprising:
    forming a GaN semiconductor layer over a substrate;
    forming an AlGaN semiconductor layer on the GaN semiconductor layer;
    forming a silicon-containing insulating layer on the AlGaN semiconductor layer;
    forming a first recess and a second recess in the silicon-containing insulating layer in a first etching step, wherein the first etching step is performed by using a fluorine-containing etchant and applying a first bias power;
    enlarging the first recess and the second recess to extend into the AlGaN semiconductor layer in a second etching step, wherein the second etching step is performed by using the fluorine-containing etchant and applying a second bias power that is greater than the first bias power, wherein the fluorine-containing etchant etches the AlGaN semiconductor layer at an etching rate of 1000 to 1500 angstrom/min;
    forming a source contact and a drain contact in the first recess and the second recess respectively, wherein the source contact includes an upper portion over an upper surface of the silicon-containing insulating layer
    forming a passivation layer to cover the source contact and the drain contact, wherein the passivation layer includes a first portion embedded in the source contact and a second portion embedded in the drain contact; and
    forming a gate contact between the source contact and the second contact, wherein a bottom surface of the source contact, a bottom surface of the drain contact and a bottom surface of the gate contact are located between a top surface of the AlGaN semiconductor layer and a bottom surface of the AlGaN semiconductor layer.

2. The method as claimed in claim 1, wherein the silicon-containing insulating layer comprises silicon oxide, silicon nitride, silicon oxynitride or a combination thereof.

3. The method as claimed in claim 1, wherein the first bias power is between 100 W and 500 W.

4. The method as claimed in claim 1, wherein the second bias power is between 1000 W and 1350 W.

5. The method as claimed in claim 1, wherein the fluorine-containing etchant comprises $C_4$, $CHF_3$, $CH_2F_2$, $CH_3F$ or a combination thereof.

6. The method as claimed in claim 1, wherein in the first etching step, an etching selectivity of the silicon-containing insulating layer to the AlGaN semiconductor layer is greater than 10.

7. The method as claimed in claim 1, wherein the first etching step and the second etching step are performed in-situ in a same etching chamber.

8. The method as claimed in claim 7, wherein the second etching step is continuously performed after completion of the first etching step without interruption.

9. The method as claimed in claim 7, wherein there is no over-etching performed on the silicon-containing insulating layer when the first etching step proceeds to an etching end point of the silicon-containing insulating layer.

10. The method as claimed in claim 1, wherein the gate contact is disposed in and in contact with the AlGaN semiconductor layer.

11. The method as claimed in claim 1, further comprising:
forming a third recess in the passivation layer, wherein the gate contact is formed in the third recess.

12. The method as claimed in claim 11, wherein the third recess is further formed in the silicon-containing insulating layer and the AlGaN semiconductor layer.

\* \* \* \* \*